US009802400B2

(12) United States Patent
Trefonas, III et al.

(10) Patent No.: US 9,802,400 B2
(45) Date of Patent: *Oct. 31, 2017

(54) ORIENTATION CONTROL LAYER FORMED ON A FREE TOP SURFACE OF A FIRST BLOCK COPOLYMER FROM A MIXTURE OF FIRST AND SECOND BLOCK COPOLYMERS

(71) Applicants: Dow Global Technologies LLC, Midland, MI (US); Rohm and Haas Electronic Materials LLC, Marlborough, MA (US)

(72) Inventors: Peter Trefonas, III, Medway, MA (US); Deyan Wang, Hudson, MA (US); Rahul Sharma, Pearland, TX (US); Phillip D. Hustad, Watertown, MA (US); Mingqi Li, Shrewsbury, MA (US)

(73) Assignees: DOW GLOBAL TECHNOLOGIES LLC, Midland, MI (US); ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 732 days.

This patent is subject to a terminal disclaimer.

(21) Appl. No.: 13/925,061

(22) Filed: Jun. 24, 2013

(65) Prior Publication Data

US 2014/0377518 A1    Dec. 25, 2014

(51) Int. Cl.
*C08L 53/00* (2006.01)
*C08L 63/00* (2006.01)
(Continued)

(52) U.S. Cl.
CPC .............. *B32B 43/00* (2013.01); *B05D 1/185* (2013.01); *B05D 7/52* (2013.01); *B32B 27/08* (2013.01);
(Continued)

(58) Field of Classification Search
CPC ...................... B81C 2201/0149; B08L 2205/00
See application file for complete search history.

(56) References Cited

U.S. PATENT DOCUMENTS 4,929,510 A   5/1990   Ruckenstein et al.
7,160,551 B2  1/2007   McHugh et al.
(Continued)

FOREIGN PATENT DOCUMENTS

WO    WO2013040483 A1    3/2013

OTHER PUBLICATIONS

Huang et al., Using Surface Active Random Copolymers to Control the Domain Orientation in Diblock Copolymer Thin Films, Macromolecules, 1998, 31, pp. 7641-7650.*
(Continued)

*Primary Examiner* — Francisco Tschen
(74) *Attorney, Agent, or Firm* — Cantor Colburn LLP

(57) ABSTRACT

Disclosed herein is a method comprising disposing a first composition comprising a first block copolymer upon a substrate; where the first block copolymer comprises a first segment and a second segment that are covalently bonded to each other and that are chemically different from each other; where the first segment has a first surface free energy and where the second segment has a second surface free energy; and disposing a second composition comprising an second copolymer upon a free surface of the first block copolymer; where the second copolymer comprises a surface free energy reducing moiety; where the surface free energy reducing moiety has a lower surface free energy than the first surface free energy and the second surface free energy; the second copolymer further comprising one or more moieties having an affinity to the first block copolymer; where the surface free energy reducing moiety is chemically different from the first segment and from the second segment.

8 Claims, 8 Drawing Sheets

(51) Int. Cl.
  *B32B 43/00*   (2006.01)
  *B05D 7/00*   (2006.01)
  *B05D 1/18*   (2006.01)
  *G03F 7/00*   (2006.01)
  *B32B 27/08*   (2006.01)

(52) U.S. Cl.
  CPC ............ *C08L 53/00* (2013.01); *G03F 7/0002* (2013.01); *B32B 2457/14* (2013.01); *C08F 2438/03* (2013.01); *Y10T 428/24942* (2015.01)

(56) References Cited

U.S. PATENT DOCUMENTS

| | | | |
|---|---|---|---|
| 8,425,982 B2 | 4/2013 | Regner | |
| 8,450,418 B2 | 5/2013 | Millward | |
| 2006/0228653 A1* | 10/2006 | Colburn | G03F 7/325 430/322 |
| 2008/0233435 A1* | 9/2008 | Hasegawa | G11B 5/855 428/826 |
| 2009/0181171 A1* | 7/2009 | Cheng | B05D 5/02 427/256 |
| 2010/0297847 A1* | 11/2010 | Cheng | B81C 1/00031 438/694 |
| 2012/0301677 A1 | 11/2012 | Russell | |
| 2013/0078576 A1* | 3/2013 | Wu | C08F 293/00 430/296 |
| 2013/0209757 A1* | 8/2013 | Willson | B29C 43/32 428/195.1 |
| 2014/0377465 A1 | 12/2014 | Trefonas, III | |
| 2014/0377518 A1 | 12/2014 | Trefonas, III et al. | |
| 2014/0378592 A1 | 12/2014 | Trefonas, III et al. | |

OTHER PUBLICATIONS

Kim et al., Phase transition behavior in thin films of block copolymers by use of immiscible solvent vapors, Soft Matter, 2011, 7, 443-447.*
Bates et al. "Polarity-Switching Top Coats Enable Orientation of Sub-10-nm Block Copolymer Domains" Science, Nov. 9, 2012, vol. 338, 775-779.
Du Yeol Ryu, et al. "A Generalized Approach to the Modification of Solid Surfaces" Science Apr. 8, 2005, vol. 308, 236-239.
Nealey et al. "Generalization of the Use of Random Copolymers to Control the Wetting Behavior of Block Copolymer Films" Macromolecules 2008, 41, 9098-9103.
P. Mansky, et al. "Controlling Polymer-Surface Interactions with Random Copolymer Brushes" Science 275, 1458 (1997).
Sanders et al. "Hexafluoroalcohol-functionalized Methacrylate Monomers for Lithographic/Nanopatterning Materials", Sigma-Aldric's Material Matters, vol. 6, Article 1. Nov. 29, 2011—pp. 1-7.
Son, et al. "Surfactant-Assisted Orientation of Thin Diblock Copolymer Films" Advanced Materials 2008, 20, 3643-3648.

* cited by examiner (C)

(B)

(A)

ORIENTATION CONTROL LAYER FORMED ON A FREE TOP SURFACE OF A FIRST BLOCK COPOLYMER FROM A MIXTURE OF FIRST AND SECOND BLOCK COPOLYMERS

BACKGROUND

This disclosure relates to orientation control layer polymers for self assembled structures, methods of manufacture thereof and to articles comprising the same. In particular, the present disclosure relates to orientation control layers that are produced on a block copolymer and that facilitate the production of microdomains that are perpendicular to the substrate.

Block copolymers form self-assembled nanostructures in order to reduce the free energy of the system. Nanostructures are those having average largest widths or thicknesses of less than 100 nanometers. The self-assembly produces periodic structures as a result of the reduction in free energy. The periodic structures can be in the form of micro domains, for example, lamellae or cylinders. Because of these structures, thin films of block copolymers provide spatial chemical contrast at the nanometer-scale and, therefore, they have been used as an alternative low-cost nano-patterning material for generating periodic nanoscale structures. While these block copolymer films can provide contrast at the nanometer scale, it is however often very difficult to produce copolymer films that can display periodicity at less than 20 nanometers. Modern electronic devices however often utilize structures that have a periodicity of less than 20 nanometers and it is therefore desirable to produce copolymers that can easily display structures that have average largest widths or thicknesses of less than 20 nanometers, while at the same time displaying a periodicity of less than 20 nanometers.

Many attempts have been made to develop copolymers that have average largest widths or thicknesses of less than 20 nanometers, while at the same time displaying a periodicity of less than 20 nanometers. The following discussion details some of the attempts that have been made to accomplish this.

FIGS. 1A and 1B depict examples of lamella forming block copolymers that are disposed upon a substrate. The block copolymer comprises a block A and a block B that are reactively bonded to each other and that are immiscible with each other. The lamellae (also sometimes referred to as microdomains) can align their microdomains to be either parallel (FIG. 1(A)) or perpendicular (FIG. 1(B)) to the surface of a substrate surface upon which they are disposed. The affinity of the block A and/or block B for the surface of the substrate determines the morphology on the substrate surface. Likewise, the affinity of the block A and/or block B for air determines the morphology at the air-block copolymer interface. The air-block copolymer interface is termed the "free surface" and is the top surface of the block copolymer prior to the addition of the top coat to the block copolymer. The lamellae can also align their microdomains to be both parallel and perpendicular to the substrate (FIG. 1(C)). In the FIG. 1(C), the lamellae of block A are perpendicular to a plane parallel to the substrate surface, while being parallel to the substrate at the upper surface that contacts air.

The perpendicularly oriented lamellae provide nanoscale line patterns, while there is no nanoscale surface pattern created by parallel oriented lamellae. Where lamellae form parallel to the plane of the substrate, one lamellar phase forms a first layer at the surface of the substrate (in the x-y plane of the substrate), and another lamellar phase forms an overlying parallel layer on the first layer, so that no lateral patterns of microdomains and no lateral chemical contrast form when viewing the film along the perpendicular (z) axis. When lamellae form perpendicular to the surface, the perpendicularly oriented lamellae provide nanoscale line patterns. Therefore, to form a useful pattern, control of the orientation of the self-assembled microdomains in the block copolymer is desirable.

With reference to the FIG. 1(C), in order to expose the perpendicular lamellae to the air interface, the uppermost layer (identified as being a layer of the B block) is etched to expose both A and B microdomains at the free surface. The presence of both microdomains of the A block and the B block at the free surface (with both being perpendicular to the substrate) provides nanoscale line patterns that can be used for nano-patterning (i.e., the development of templates and photoresists for the development of semiconductors). In short, when the free surface interactions are unbalanced, a skin layer forms of the block with the lowest surface energy.

External orienting factors are often used to facilitate orientation of the block copolymer microdomains. Without external orientation control, thin films of block copolymers tend to self-organize into randomly oriented nanostructures with undesired morphologies, which are of little use for nano-patterning because of the random nature of the features. Orientation of block copolymer microdomains can be obtained by guiding the self-assembly process with an external orientation biasing method. Examples of this biasing method include the use of a mechanical flow field, an electric field, a temperature gradient, by using a surface modification layer upon which the block copolymer is disposed, or by adding a surfactant to the copolymer. The copolymers generally used for these particular form of guided self-assembly are polystyrene-polymethylmethacrylate block copolymers or polystyrene-poly(2-vinylpyridine) block copolymers.

The FIG. 2 details one method of using a surface modification layer upon which a block copolymer is disposed to produce a film having controlled microdomain sizes and periodicity and orientation. The method depicted in the FIG. 2, has been previously detailed by P. Mansky, Y. Liu, E. Huang, T. P. Russell, C. Hawker, *Science* 275 (1997), 1458. As with the FIG. 1, the block copolymer of the FIG. 2 comprises a block A and a block B. The substrate in the FIG. 2 is coated with a surface modification layer that is affixed to the surface. The surface modification layer is formed by crosslinking or is reactively bonded (covalently, ionically or hydrogen bonded) to the surface of the substrate. Any additional excess material is removed prior to or during the bonding. The block copolymer is then coated on the surface modification layer of the substrate.

Surfactants can also be an external orienting factor that can be used to control free surface interactions. Oleic acid has been used as a surfactant when casting a block copolymer comprising polystyrene and polymethylmethacrylate. The perpendicular morphology has been found to persist over a range of thicknesses when the copolymer was cast on non-neutral substrates. The block copolymer after being cast on a substrate is optionally annealed with heat (in the presence of an optional solvent), which allows for phase separation of the immiscible polymer blocks A and B. The annealed film can then be further developed by a suitable method such as immersion in a solvent/developer or by reactive ion etching which preferentially dissolves one polymer block and not the other to reveal a pattern that is commensurate with the positioning of one of the blocks in the copolymer.

While these particular methods of external orienting produce block copolymers, some of them are expensive (e.g., reactive ion etching) while others (e.g., the use of a surfactant) leave behind residues that make their use impractical.

SUMMARY

Disclosed herein is a method comprising disposing a first composition comprising a first block copolymer upon a substrate; where the first block copolymer comprises a first segment and a second segment that are covalently bonded to each other and that are chemically different from each other; where the first segment has a first surface free energy and where the second segment has a second surface free energy; and disposing a second composition comprising an second copolymer upon a free surface of the first block copolymer; where the second copolymer comprises a surface free energy reducing moiety; where the surface free energy reducing moiety has a lower surface free energy than the first surface free energy and the second surface free energy; the second copolymer further comprising one or more moieties having an affinity to the first block copolymer; where the surface free energy reducing moiety is chemically different from the first segment and from the second segment.

Disclosed herein too is a multilayered article comprising a first layer comprising a first block copolymer; where the first block copolymer comprises a first segment and a second segment that are covalently bonded to each other and that are chemically different from each other; where the first segment has a first surface free energy and where the second segment has a second surface free energy; and a second layer comprising a second copolymer disposed upon a free surface of the first block copolymer; where the second copolymer comprises a surface free energy reducing moiety; where the surface free energy reducing moiety has a lower surface free energy than the first surface free energy and the second surface free energy; the second copolymer further comprising one or more moieties having an affinity to the first block copolymer; where the surface free energy reducing moiety is chemically different from the first segment and from the second segment.

DETAILED DESCRIPTION

Figure 1:
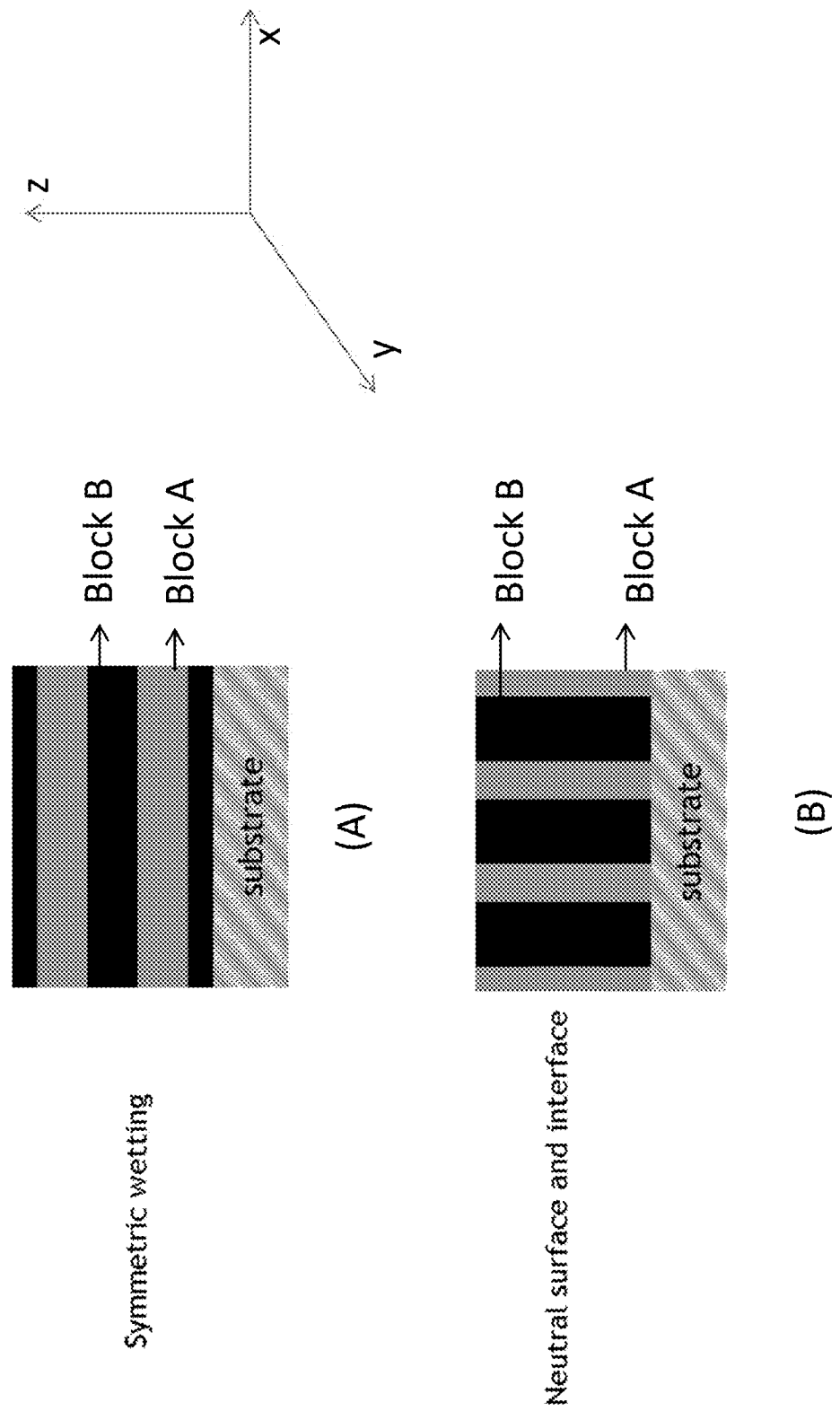
FIG. 1A depicts an example of microdomain-forming block copolymers that are disposed upon a substrate, where the micro domains are parallel to the surface of the substrate.
FIG. 1B depicts another example of microdomain forming block copolymers that are disposed upon a substrate, where the microdomains are perpendicular to the surface of the substrate.
FIG. 1C depicts yet another example of microdomain forming block copolymers that are disposed upon a substrate, where the microdomains are perpendicular as well as parallel to the surface of the substrate.
Figure 1C:
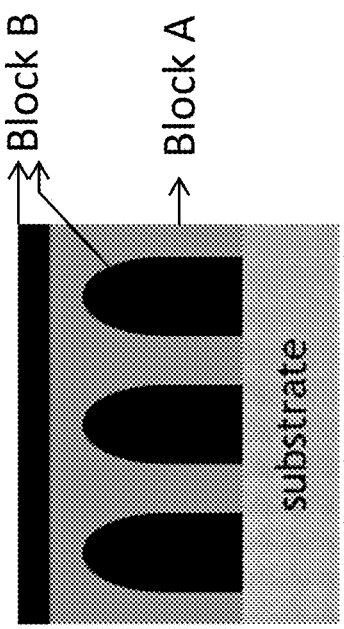
Figure 2:
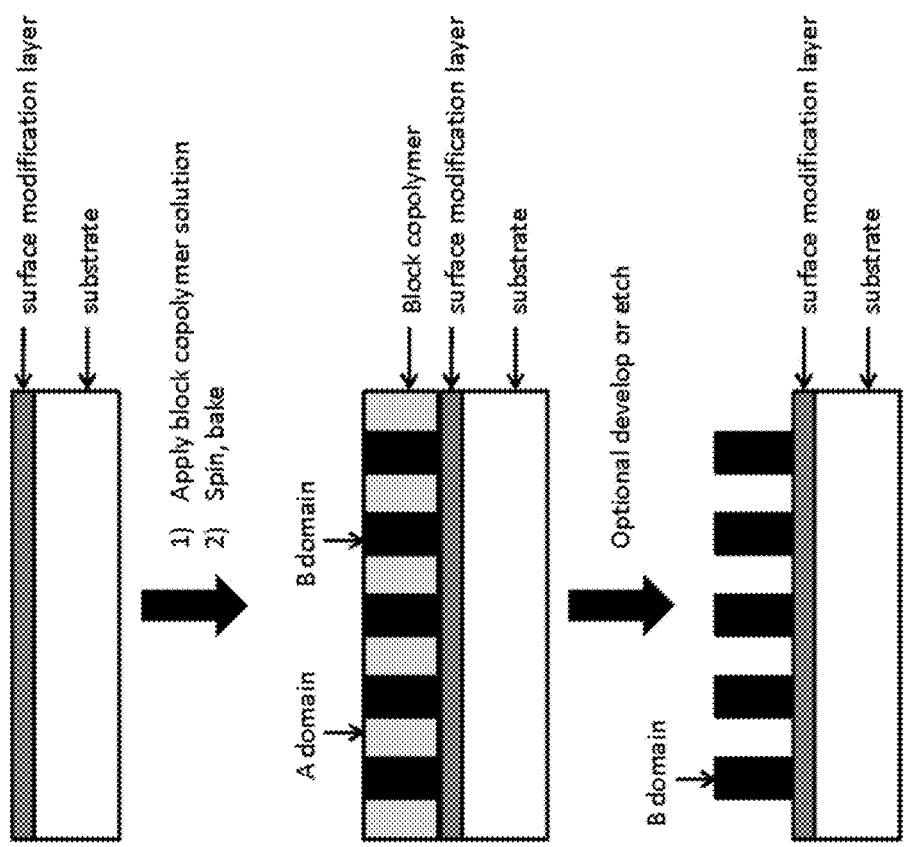
FIG. 2 details one method of using a surface modification layer upon which a block copolymer is disposed to produce a film having controlled microdomain sizes and periodicity.

Disclosed herein is a first composition that comprises a first block copolymer upon which is disposed an orientation control layer that comprises a second copolymer. The second copolymer is contained in a second composition and is disposed upon the first block copolymer to form the orientation control layer. In an embodiment, the first composition can also comprise the second copolymer in addition to the block copolymer. The second copolymer comprises a polymeric surface free energy reducing moiety and at least one polymeric entity that is contained in the first block copolymer or a polymeric entity that is not contained in the first block copolymer but is compatible with the at least one polymeric entity that is contained in the first block copolymer. The first block copolymer and the second copolymer are not however covalently bonded to each other.

The polymeric surface free energy reducing moiety permits the formation of a first orientation control layer at the top coat-block copolymer interface (hereinafter "the free surface") when the first composition is disposed on a substrate or upon an optional neutral layer (hereinafter a "surface modification" layer) that is itself disposed upon the substrate. The second copolymer can comprise a single copolymer or can comprise a blend of copolymers each of which comprise a surface energy reducing moiety. In a blend of copolymers, the surface free energy reducing moiety can be the same or can be different for each independent copolymer (i.e., each second copolymer can have a different surface energy reducing moiety).

The second copolymer is disposed upon a free surface of the first block copolymer and forms an orientation control layer at the top coat-block copolymer interface that facilitates the formation of microdomains in the first block copolymer that are perpendicular to the surface of a substrate upon which the first block copolymer is disposed. The top layer is neutral in its interactions with each of the microdomains of the first block copolymer and therefore is termed a "orientation control layer". The "orientation control layer" does not display preferential interactions with either domain of the first block copolymer and therefore facilitates the formation of microdomains that are perpendicular to the substrate.

In one embodiment, the second copolymer may be intimately mixed with the first block copolymer prior to being disposed upon a substrate in the form of a coating. A separate top coat of a second copolymer may then be disposed upon the coating to facilitate the formation of the orientation control layer. The orientation control layer will therefore contain the second copolymer from the coating on the substrate as well as from the top coat. In summary, the second copolymer may be present in a composition with the first block copolymer and can also be separately disposed upon a surface of the composition (that comprises either the first block copolymer or a combination of the first block copolymer and the second copolymer) after it is disposed upon a substrate. It is to be noted that a second copolymer may be used in the first composition (i.e., the composition that comprises the first block copolymer), while the second copolymer is also disposed on the first block copolymer as the top coat. The surface free energy reducing moiety comprises silicon atoms, fluorine atoms, a substituted or unsubstituted $C_{1-12}$ hydrocarbyl group, or a combination thereof.

Both the "polymeric surface free energy reducing moiety" and the at least "one polymeric entity" are either polymeric or are part of a polymer, hence the use of the prefix "polymeric". The second copolymer may also be understood as being orientation control layer that phase segregates after casting of the second composition on the first composition to form an actual orientation control layer at the free surface, while permitting the respective microdomains of the first block copolymer to be oriented perpendicular to the substrate so that they can be used to form a nanostructure that is eventually used to form a photoresist or a template for patterning a semiconductor. In an alternative embodiment, the second copolymer forms the orientation control layer after being disposed upon a first composition that comprises the first block copolymer or a composition that comprises the first block copolymer and the second copolymer.

In another embodiment, the first composition comprises a first block copolymer comprising a first polymeric segment (hereinafter first segment) and a second polymeric segment (hereinafter second segment) that are covalently bonded to each other and that are chemically different from each other. The first segment has a first surface free energy and the second segment has a second surface free energy.

The surface free energy reducing moiety has a lower surface free energy than that of the first surface free energy and the second surface free energy. As noted above, the second copolymer further comprises one or more moieties having an affinity to the first block copolymer. The second copolymer is part of the second composition. The second composition may further comprise a solvent that does not solvate the first block copolymer. The solvent contained in the second composition generally has a higher surface free energy than the second copolymer.

The second copolymer is not covalently bonded with the first block copolymer and is operative to form an orientation control layer on a surface of the first block copolymer that facilitates the formation of microdomains in the first block copolymer. These microdomains are perpendicular to a surface of the substrate that the first composition is disposed on. In other words, the microdomains that are perpendicular to the surface of the substrate that the first block copolymer is disposed upon. As noted above, the orientation control layer can be formed by disposing the second copolymer in the form of a top coat on the first block copolymer after the first block copolymer has been disposed upon a substrate. In an embodiment, the second copolymer is not a surfactant.

Disclosed herein too is a method comprising disposing the first composition comprising the first block copolymer on a substrate and disposing the second composition that comprises the second copolymer on the first block copolymer. The method results in the formation of a layered article that contains a first layer comprising the first block copolymer and a second layer comprising the second block copolymer. The method further comprises annealing the layered article at a temperature from room temperature up to the highest glass transition temperature of the first block copolymer (when all the polymers in the first block copolymer are amorphous) or up to the highest melting point of the first block copolymer (when at least one of the polymers in the first block copolymer are semicrystalline).

The method further comprises annealing the layered article at a temperature above the highest glass transition temperature of the block copolymer (when all the polymers in the block copolymer are amorphous) or above the highest melting point of the block copolymer (when at least one of the polymers in the block copolymer are semicrystalline) but below the order-disorder transition temperature of the block copolymer Disclosed herein too is a method comprising disposing the first composition (that comprises a first block copolymer and the second copolymer upon the substrate or upon the optional neutral layer disposed upon the substrate, and disposing a layer of the second composition that comprises the second copolymer upon the free surface of the first block copolymer (e.g., in the form of a top coat). The method further comprises annealing the layered article as detailed above.

The annealing permits the formation of an orientation control layer at the free surface of the first block copolymer and the formation of perpendicular microdomains on the substrate. The orientation control layer may then be treated to expose the perpendicular microdomains of the block copolymer on the substrate.

The first block copolymer can comprise two or more polymeric segments—a first segment and a second segment that are chemically dissimilar from each other and that are covalently bonded to each other and that phase segregate into microdomains upon being disposed upon the substrate. The first segment and/or the second segment may or may not contain the surface energy reducing moiety. In a preferred embodiment, the first segment and/or the second segment may or may not contain the surface energy reducing moiety. In other words, the surface free energy reducing moiety has a different chemical composition from that of the first segment or that of the second segment. In an exemplary embodiment, the first block copolymer does not contain the surface free energy reducing moiety.

The first block copolymer when disposed upon a substrate or upon a surface modification layer produces microdomains that are perpendicular to the surface of the substrate. In other words, a longitudinal axis of each domain of the first block copolymer is perpendicular to the surface of the substrate upon which the first block copolymer is disposed, after the annealing. It is desirable for the microdomains to have an average width of less than or equal to 100 nanometers, specifically less than or equal to 70 nanometers, specifically less than or equal to 50 nanometers, and more specifically less than or equal to 20 nanometers. In an exemplary embodiment, it is desirable for the average width of the microdomains to be less than 20 nanometers. The width is measured parallel to the surface of the substrate (i.e., measured in a direction parallel to the y-axis and the z-axis in the FIG. 1(A) detailed above.). It is also desirable for the average interdomain periodicity to be less than or equal to 100, specifically less than or equal to 70 nanometers, specifically less than or equal to 50 nanometers, and more specifically less than or equal to 20 nanometers. In an exemplary embodiment, it is desirable for the average inter-domain periodicity of the microdomains to be less than equal to 20 nanometers.

As detailed above, the first block copolymer is disposed upon the substrate or upon the surface modification layer to produce microdomains that are perpendicular to the surface of the substrate. By selecting a first block copolymer whose surface energy differs as minimally as possible from the surface energy of the surface modification layer, the domain sizes, the domain geometry and the inter-domain spacing can be carefully controlled. It is desirable to select a first block copolymer having a number average molecular weight for each block that enables the block copolymeric film to form lamellar or cylindrical microdomains having a perpendicular orientation to the surface of the substrate upon which the first block copolymer is disposed.

Block copolymers are polymers that are synthesized from two or more different monomers and exhibit two or more polymeric chain segments that are chemically different, but yet, are covalently bound to one another. Diblock copolymers are a special class of block copolymers derived from two different monomers (e.g., A and B) and having a structure comprising a polymeric block of A residues (e.g., A segments) covalently bound to a polymeric block of B residues (e.g., B segments) (e.g., AAAAA-BBBBB). The first block copolymer can comprise di-block copolymers, tri-block copolymers, star block copolymers, random copolymers, alternating block copolymers, multiblock copolymers, gradient block copolymers, or combinations thereof.

The term "segment" as used herein with regard to the first block copolymer or the second copolymer comprises a polymeric segment or a polymeric block. The polymeric segment or block can comprise a small number of repeat units (e.g., 1, 2, 3, 4, . . . up to 50) so long as it is copolymerized with another polymeric segment to form a copolymer that has a molecular weight greater than or equal to about 2,000 grams per mole.

The segments can in general be any appropriate domain-forming segment to which another chemically dissimilar segment can be covalently bonded. "Chemically dissimilar" implies that the two segments have different chemical structures. The different structures can be chemically different (i.e., have different molecules) or racemically different (i.e., have left- and right-handed enantiomers of a chiral molecule), or isotopically different. Segments can be derived from different polymerizable monomers, where the segments can include polyolefins including polydienes, polyethers including poly(alkylene oxides) such as poly(ethylene oxide), polypropylene oxide), poly(butylene oxide), poly((meth)acrylates), polystyrenes, polyesters, polyorganosiloxanes, or polyorganogermanes.

In one embodiment, the segments of the first block copolymer comprise as monomers $C_{2-30}$ olefinic monomers, (meth)acrylate monomers derived from $C_{1-30}$ alcohols, inorganic-containing monomers including those based on iron, silicon, germanium, tin, aluminum, titanium, or a combination comprising at least one of the foregoing monomers. Exemplary monomers for use in the segments can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or a-methylstyrene; and can include as (meth)acrylate monomers, methyl (meth)acrylate, ethyl(meth)acrylate, n-propyl(meth)acrylate, isopropyl(meth)acrylate, n-butyl(meth)acrylate, isobutyl(meth)acrylate, n-pentyl(meth)acrylate, isopentyl (meth)acrylate, neopentyl(meth)acrylate, n-hexyl(meth) acrylate, cyclohexyl(meth)acrylate, isobornyl(meth)acrylate, or hydroxyethyl(meth)acrylate. Combinations of two or more of these monomers can be used.

Exemplary segments which are homopolymers can include segments prepared using styrene (i.e., polystyrene blocks), (meth)acrylate homopolymeric segments such as poly(methylmethacrylate), 2-vinylpyridine (i.e., poly(2-vinylpyridine blocks), or dialkylsiloxane (i.e., poly(dimethylsiloxane segments); exemplary random segments include, for example, segments of styrene and methyl methacrylate (e.g., poly(styrene-co-methyl methacrylate)), randomly copolymerized; and an exemplary alternating copolymer block can include segments of styrene and maleic anhydride, which is known to form a styrene-maleic anhydride diad repeating structure due to the inability of maleic anhydride to homopolymerize under most conditions (e.g., poly(styrene-alt-maleic anhydride)). It will be understood that such segments are exemplary and should not be considered to be limiting.

Exemplary first block copolymers that are contemplated for use include diblock or triblock copolymers such as poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl(meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(styrene-b-trimethylsilylmethyl methacrylate), poly(methyl methacrylate-b-dimethylsiloxane), poly(methyl methacrylate-b-trimethylsilylmethyl methacrylate), or the like, or a combination comprising at least one of the foregoing block copolymers.

The first block copolymer is present in the composition in an amount of 25 to 95 weight percent, based on the total weight of the composition. In a preferred embodiment, the first block copolymer is present in the first composition in an amount of 50 to 90 weight percent, based on the total weight of the composition. The remainder of the first composition may be a solvent that solvates the first block copolymer.

The surface modification layer is an optional layer and its use depends upon the composition of the substrate. If the substrate has the appropriate characteristics for facilitating the formation of perpendicular microdomains in the first block copolymer, then a surface modification layer may not be desirable. If, on the other hand, the substrate does not possess favorable characteristics for facilitating the formation of perpendicular microdomains, then it may be desirable to use the surface modification layer. The surface modification layer can be characterized as having a similar surface tension between the surface modification layer and the respective polymers comprising the blocks of the first block copolymer. In one embodiment, the surface modification layer comprises a random copolymer comprising two or more homopolymeric repeat units that have difference in surface energy of 0.01 to 10 milli-Newton per meter (mN/m), specifically 0.03 to 3 mN/m, and more specifically 0.04 to 1.5 mN/m. For example, orientation control layers for polystyrene and polymethylmethacrylate usually comprise polystyrene and polymethylmethacrylate, which only have a difference in surface energy of 0.04 mN/m from the respective blocks.

In an embodiment, it is desirable for the orientation control layer, both on top and bottom of the film (the orientation control layer at the bottom being the surface modification layer), to have a balanced surface tension between the A and B blocks. Good results will be achieved when the surface tensions are equal. This is the only prerequisite and a number of materials can achieve this end result. For example, a random copolymer comprising two segments, e.g. polystyrene randomly copolymerized with polymethylmethacrylate (P(S-r-MMA)) is useful as an orientation control layer for a first block copolymer comprising polystyrene (PS) and polymethylmethacrylate (PMMA). In a similar manner, a homopolymer that happens to have surface energy exactly in between the two segments of polystyrene and polymethylmethacrylate can be used to form the orientation control layer.

Each repeat unit is chemically and/or structurally different from the other repeat unit in the random copolymer. The random copolymer comprises a first homopolymeric repeat unit having a surface energy of 35 to 50 milli-Newton per meter (mN/m) and a second repeat unit having a surface energy of 15 to 30 mN/m. The total surface energy of the random copolymer is 15 to 40 mN/m. The surface energy is calculated using the Owens-Wendt method from the contact angles of water (18 ohm deionized water) and methylene iodide ($CH_2I_2$) and diethylene glycol, which are measured on a contact angle goniometer by the Sessile Drop method.

In one embodiment, the surface modification layer comprises a random copolymer that can be crosslinked upon being disposed upon the substrate. The random copolymer comprises at least two repeat units at least one of which contains a reactive substituent along the chain backbone that can be used to crosslink the random copolymer after it is disposed upon the substrate. The surface modification layer crosslinked in this manner is then described as being in the form of a mat-like film on the surface of the substrate.

In another embodiment, the surface modification layer comprises a random copolymer that comprises a reactive end group that can react with a functional group disposed upon the surface of the substrate to form a brush on the substrate. The surface modification layer disposed upon the substrate in this manner is then described as being in the form of a brush on the surface of the substrate.

In yet another embodiment, the surface modification layer comprises a random copolymer that comprises at least one reactive substituent along the chain backbone and in addition comprises a reactive end group that can react with a functional group disposed upon the surface of the substrate to form a brush on the substrate. A copolymer containing both reactive functionalities can thus form either a mat or a brush depending upon the kinetics of the reaction. For example, if the end groups are first reacted with the substrate followed by reacting the substituents, the surface modified film is expected to have characteristics that are more brush-like than mat-like. However, if the crosslinking reaction is first triggered, followed by reacting the surface groups, then the surface film will have characteristics that are more mat-like and less brush-like. Reaction conditions, the reactants, the solvents use to disperse the reactants, the chemistry of the substrate, and the structure and chemistry of the random copolymer can thus all be tailored to tune in the type of surface characteristics that are desired in the surface modification film and consequently in the first block copolymer.

The second copolymer (that is present in the second composition and that is used to produce the orientation control layer) comprises a polymeric surface free energy reducing moiety and at least one polymeric entity that is also contained in the first block copolymer or that is compatible with at least one polymeric entity contained in the first block copolymer. The second copolymer is not covalently bonded to the first block copolymer. The surface free energy reducing moiety of the second copolymer is covalently bonded to a plurality of the same monomers that comprise the first segment and/or to the same monomers that comprise the second segment. In other words, the surface free energy reducing moiety of the second copolymer is covalently bonded to a segment that is chemically similar to the first segment and/or chemically similar to the second segment. The surface free energy reducing moiety is not however, covalently bonded to the first segment or to the second segment of the block copolymer.

The second copolymer has an ability to phase segregate from the first block copolymer and form an actual orientation control layer on the surface of the first block copolymer after being disposed upon the free surface of the first block copolymer. The orientation control layer also permits the segments of the first block copolymer to form microdomains (that are perpendicular to the substrate) upon being disposed upon the substrate. The orientation control layer further permits the first block copolymer to be annealed above the glass transition temperature of the block copolymer as the surface free energy reducing moiety serves to anchor the layer at the top surface and minimizes intermixing of the second copolymer layer (the second layer) with the first block copolymer layer (i.e., the first layer).

The polymeric surface free energy reducing moiety (hereinafter "surface energy reducing moiety") generally comprises silicon atoms, fluorine atoms, an unsubstituted or substituted $C_1$-$C_{12}$ hydrocarbyl, or a combination of silicon atoms, fluorine atoms and/or unsubstituted or substituted $C_1$-$C_{12}$ hydrocarbyl. The surface free energy reducing moiety facilitates the segregation of the orientation control layer from the block copolymer after the second copolymer is disposed upon the first block copolymer. The surface free energy reducing moiety may be covalently bonded to at least one moiety that is similar to a moiety contained in the first block copolymer. For example, if the block copolymer contains two segments—a first segment A and a second segment B, then the second copolymer may comprise one or more of the monomeric moieties that react to form segment A, one or more of the monomeric moieties that react to form segment B, or a combination of one or more of the monomeric moieties that react to form segment A and one or more of the monomeric moieties that react to form segment B, in addition to the surface energy reducing moiety. Examples of the monomers that can be used to form the segments of the second copolymer are listed above in the details provided for the first block copolymer (e.g., $C_{2-30}$ olefinic monomers, (meth)acrylate monomers derived from $C_{1-30}$ alcohols, and the like).

For a first block copolymer comprising two segments—segment A and segment B, where segment A comprises repeat units of an exemplary unit A, and segment B comprises repeat units of an exemplary unit B, the second copolymer may comprise one or more of the unit A, one or more of the unit B, or both the units A and B, in addition to a surface free energy reducing moiety X. In another embodiment, the second copolymer may comprise one or more of a unit A', one or more of the unit B', or both the units A' and B', in addition to a surface free energy reducing moiety X, such that A' and B' are completely or partially miscible with A and B respectively. In one embodiment, A may be chemically identical or different from A', while B may be chemically identical or different from B'.

The following exemplary structures can be used to form the second copolymer that eventually phase segregates from the first block copolymer to form the orientation control layer. It is assumed that the first block copolymer comprises two segments A and B. In one embodiment, the second copolymer is a random copolymer, or a block copolymer comprising repeat units A, B, or X and having the structure of formula (1)

 (1)

where units A and B are similar to the units A and B in the first block copolymer, and where X is the surface energy reducing moiety, where n is 0 to 50, specifically 1 to 45, m is 0 to 50, specifically 1 to 45, and where p is 1 to 50, specifically 5 to 40, where n, m and p are independent or each other, and where n and m are both not equal to 0 at the same time. The surface free energy reducing moiety X can therefore be a single unit or a plurality of units. In other words, it can be a reacted monomeric unit, an oligomeric unit (having between 2 to 10 repeat units) or a polymeric unit (having more than 10 repeat units). When the second copolymer of the formula (1) is a random copolymer, the positions of A, B and X can be randomly interchanged. In an embodiment, A is present in an amount of 0 to 50 mole percent, specifically 1 to 40 mole percent, based on the total number of moles of the second copolymer, B is present in an amount of 0 to 50 mole percent, specifically 1 to 40 mole percent, based on the total number of moles of the second copolymer, and X is present in an amount of 1 to 50 mole percent, specifically 2 to 40 mole percent, based on the total number of moles of the second copolymer.

In one embodiment, the second copolymer is a random copolymer or a block copolymer comprising repeat units A, C, or X and having the structure of formula (2)

 (2)

where C is an alternative unit that can be combined with the units A or B to achieve neutrality for the second copolymer; and where n, m and p are as detailed above in the formula (1). The molar content of A and X in the second copolymer are detailed above, while the molar content of C is similar to that of B as detailed above.

In another embodiment, the second copolymer can comprise a block copolymer comprising blocks of units A and B and blocks of X as shown by the structure of formula (3).

 (3)

where units of A and B are arranged to alternate with each other and form a first block while the surface free energy reducing moiety X forms a second block; where o has a value of 1 to 50 and p has a value of 1 to 50; and where o and p are independent of each other. The molar content of A, B and X based on the total number of moles of the second copolymer are detailed above.

In yet another embodiment, the second copolymer may comprise a blend of copolymers of A and X and B and X as shown in the formulas (4) and (5) or a blend of copolymers of A and X and C and X as shown in the formulas (4) and (6) below

 (4)

 (5), and

 (6)

where A, B and C are as described above, and where o has a value of 1 to 50 and p has a value of 1 to 50; and where o and p are independent of each other. The copolymers of A and X, B and X, and C and X, can be alternating copolymers, di-block copolymers, or random copolymers.

The copolymer of A and X and the copolymer of B and X, may be used in weight ratios of 1:99 to 99:1, specifically 10:90 to 90:10, and more specifically 30:7 to 70:30. An exemplary weight ratio of the copolymer of A and X and the copolymer of B and X is 50:50. The copolymer of A and X and the copolymer of C and X may be used in weight ratios of 1:99 to 99:1, specifically 10:90 to 90:10, and more specifically 30:7 to 70:30. An exemplary weight ratio of the copolymer of A and X and the copolymer of C and X is 50:50.

In one embodiment, the second copolymer may be a gradient polymerized polymer or a blend of gradient polymerized polymers. A gradient polymerized polymer is one where the percentage of one component (e.g., A, B or C) increases relative to the percentage of the other component (e.g., X) as the copolymer chain is traversed from one end to the other. In one embodiment, the gradient polymerized chain may be a gradient random polymer of A, B and X with increasing X as the copolymer chain is traversed from one end to the other as seen in the formula (7):

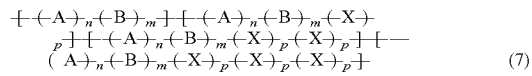 (7)

where A, B and X are as monomeric units as described above, where n, m and p each can have a value of 1 to 50 and can be the same or different or independent to each other. In one embodiment, in the formula (7), n=m for each segment. In other words, if n=m=1 in the first segment, it is the same for each succeeding segment as the copolymer chain is traversed from one end to the other. The value also remains the same for each succeeding segment as the copolymer chain is traversed from one end to the other. The gradient polymerized polymer of formula (7) may be a random copolymer. The molar ratios of A, B and X in the formula (7) are the same as those described for the structure of formula (1) above.

In another embodiment, n, m and p can be independent from each other in each segment but are the same for every succeeding segment as the polymer chain is traversed from one end to the other. In other words, for example, if n=1, m=4 and p=3 for each segment, then it is the same for each succeeding segment as the copolymer chain is traversed from one end to the other.

In another embodiment, the unit A or the unit B in the equation (7) can be replaced with unit C, where C is defined above.

In another embodiment, the second copolymer can be a block copolymer of A and B with increasing X as the copolymer chain is traversed from one end to the other as shown in the formula (8)

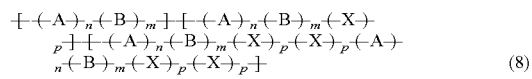 (8)

where A, B and X are as monomeric units as described above, where n, m and p each can have a value of 1 to 50 and can be the same or different or independent to each other. In one embodiment, in the formula (7), n=m for each segment. In other words, if n=m=1 in the first segment, it is the same for each succeeding segment as the copolymer chain is traversed from one end to the other. The value also remains the same for each succeeding segment as the copolymer chain is traversed from one end to the other. In another embodiment, n, m and p can be independent from each other in each segment but are the same for every succeeding segment as the polymer chain is traversed from one end to the other. In other words, for example, if n=1, m=4 and p=3 for each segment, then it is the same for each succeeding segment as the copolymer chain is traversed from one end to the other. The molar ratios of A, B and X in the formula (8) are the same as those described for the structure of formula (1) above. In the formula (8), the unit A or the unit B can be replaced with C.

In another embodiment, the second copolymer can be a block copolymer with the random incorporations of X into the blocks as seen in the formula (9)

  (9)

where in the equation (9), A, B and X have the meanings detailed above, "r" indicates that A and X are randomly copolymerized in a first segment. The first segment has k repeat units. This first segment is copolymerized with a second segment comprising B and X, which are also randomly copolymerized. The second segment has h repeat units. In one embodiment, k and h can be the same or different and can be 1 to 50. The letter "b" in the formula (9) indicates that the first segment and the second segment are in the form of a block copolymer. The molar ratios of A, B and X in the formula (9) are the same as those described for the structure of formula (1) above. The unit A or the unit B in the formula (9) can be replaced with the unit C.

In another embodiment, the block copolymer comprises repeat units of A that are copolymerized with segments comprising B and X that are randomly copolymerized.

  (10)

where A, b, B, r, k, h and X have the meanings ascribed to them above. The molar ratios of A, B and X in the formula (7) are the same as those described for the structure of formula (1) above. The unit A or the unit B in the formula (10) can be replaced with the unit C. It is to be noted that the second copolymer of the formulas (1) through (10) may be deployed in a star block configuration if desired.

Figure 3:
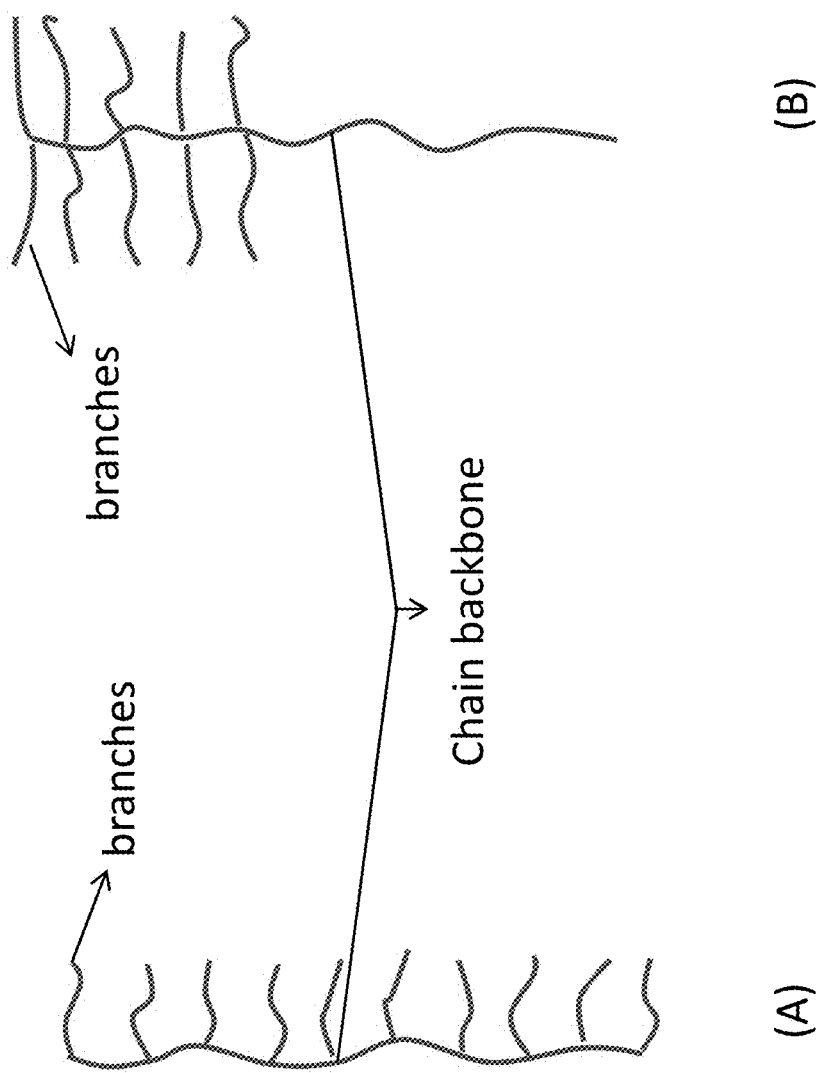
FIG. 3A depicts a copolymer having a comb topology with branches that are grafted onto the chain backbone and extend in only one direction.
FIG. 3B depicts a copolymer having a bottle brush topology with branches that are grafted onto the chain backbone and extend radially in all directions from the chain backbone.

In another embodiment, the second copolymer (that facilitates the formation of the orientation control layer) may be a graft polymer. For example, the second copolymer may have a comb topology or can comprise a bottle brush type copolymer. A comb topology is where the copolymer backbone has grafted onto it a number of branches of roughly equivalent number of repeat units as shown in the FIG. 3(A). As can be seen in the FIG. 3(A), the branches that are grafted onto the chain backbone extend in only one direction from the backbone. In the bottle brush type copolymer, a portion of the polymeric chain backbone has branches grafted onto it that extend radially in all directions. This is depicted in the FIG. 3(B).

One of the differences between a comb polymer and a "bottle brush" polymer is the density of the branches. In general, combs have fewer grafts and therefore the backbone of the copolymer can still be a random coil. In bottle brushes, the branch density is so high and the backbone is so crowded that they cannot coil and are therefore fully extended.

The second copolymer can comprise structures shown in the formulas (11), (12) and (13) each of which can be employed in either a comb topology or in a bottle brush topology.

In the formula (11), repeat units of D form the second copolymer backbone, while repeat units of A, B and X are grafted onto the backbone. The grafts comprising A, B and X are termed side chains and are grafted onto the backbone of the second copolymer as seen in the structure of formula (11).

  (11)

where repeat units of D form the chain backbone and where repeat units of A, B and X are grafted onto the backbone. A, B and X are as defined above. The number of repeat units e, f and g can be the same or different from each other, while the number of repeat units x, y and z can be the same or different from each other as well. In an exemplary embodiment, each of e, f and g can be an amount of 1 to 50, specifically 5 to 40, while each of x, y and z can also be an amount of 1 to 50, specifically 5 to 40. The second copolymer of the formula (11) can be a block copolymer or a random copolymer.

In another embodiment, the side chains that are grafted onto the backbone of the second copolymer can themselves be block copolymers as depicted in the structure of the formula (12)

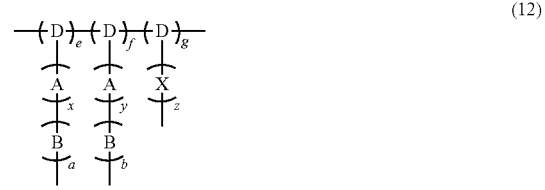  (12)

where D, A, B, X, e, f, g, x, y, and z are as described above. In the formula (12), it can be seen that some of the grafts are block copolymers while others are not. The number of repeat units "a" and "b" can be the same or different from each other and can independently be an amount of 1 to 50, specifically 5 to 40. The number of repeat units a and b can also be the same or different from x and y. The second copolymer of the formula (12) can be a block copolymer or a random copolymer.

In yet another embodiment, the side chains that are grafted onto the backbone of the second copolymer can each comprise block copolymers having repeat units of A, B and X as seen in the structure having the formula (13)

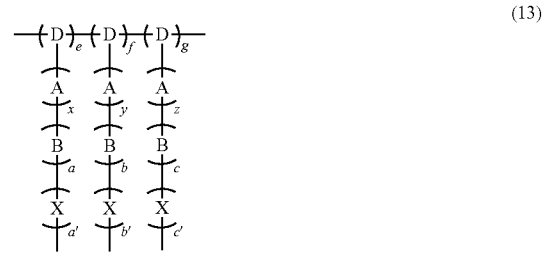  (13)

where D, A, B, X, e, f, g, x, y, and z are as described above. In the formula (13), it can be seen that some of the grafts are block copolymers while others are not. The number of repeat units "a", "b" and "c" can be the same or different from each other and can independently be an amount of 1 to 50, specifically 5 to 40. The number of repeat units "a'", "b'" and "c'" can be the same or different from each other and can independently be an amount of 1 to 50, specifically 5 to 40. The number of repeat units a, b and c can also be the same or different from x, y and z. The number of repeat units a', b' and c' can also be the same or different from x, y and z. The second copolymer of the formula (13) can be a block copolymer or a random copolymer. Blends of the second copolymer of the formulas (11), (12) and/or (13) can be used.

It is to be noted that in any of the formulas (1) through (13) above, the unit A may be replaced with a unit A' that is chemically different from unit A, but is completely or partially miscible with it. In a similar manner, unit B may be replaced with another unit B' that is chemically different from unit A, but is completely or partially miscible with it. In this reference A' and B' are referred to as a third polymer and a fourth block polymer respectively.

In one embodiment, the third segment A' can be the same or different from the first segment A, while the fourth segment B' can be the same or different from the second segment B.

The surface free energy reducing moiety can be a molecule that comprises a fluorine atom, a silicon atom, an unsubstituted or substituted $C_1$-$C_{12}$ hydrocarbyl, or a combination thereof.

The surface free energy reducing moiety can be a single unit (i.e., a reacted monomeric unit), an oligomeric unit (i.e., having 2 to 10 repeat units) or a polymeric unit (having more than 10 repeat units) and comprises a reactive functionality. The reactive functionality facilitates a reaction with the repeat units A, B, C or D listed in formulas (1) through (13) detailed above. Examples of these reactive functionalities are alkenyl groups (e.g., vinyl groups), alkynyl groups, epoxide groups, benzyl groups, phenyl groups, hydroxyl groups, carboxylate groups, thiol groups, halogen functional groups, and the like.

Figure 4:
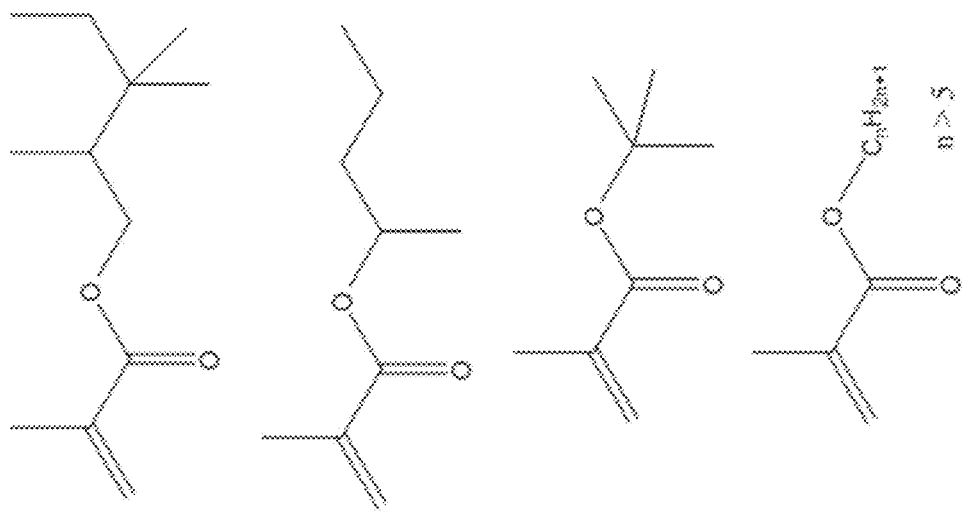
FIG. 4 is a figure the depicts various molecules that can be used as surface energy reducing moiety.
Figure 4:
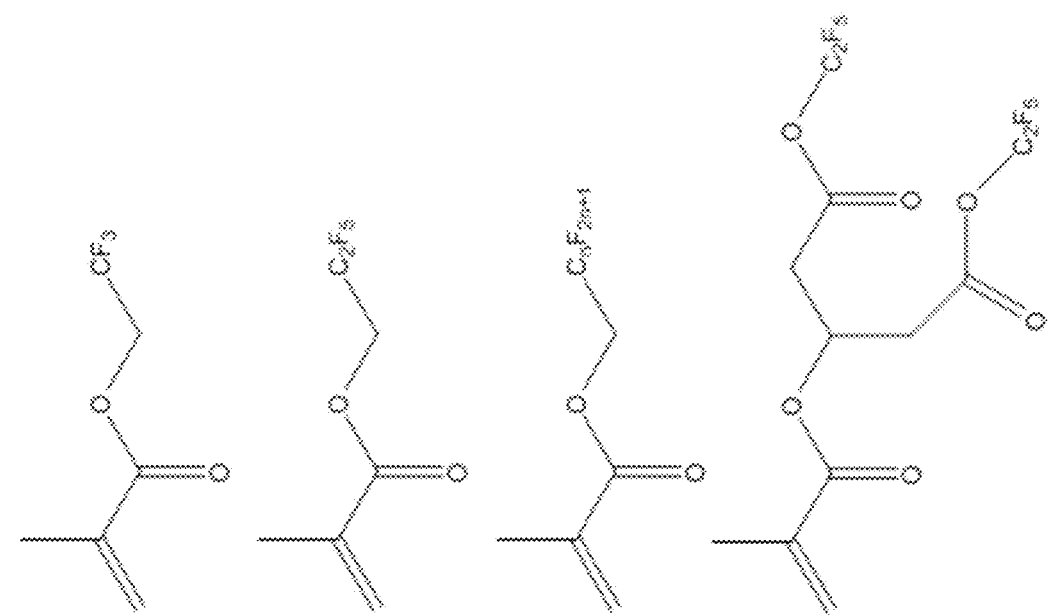

Exemplary surface energy reducing moieties are depicted in the FIG. 4.

If the second copolymer is present in the composition, it is present in an amount of 1 to 20 weight percent, specifically 2 to 14 weight percent, and more specifically 3 to 10 weight percent, based on the total weight of the composition.

In one embodiment, in one method of producing the second copolymer, the reactants along with the appropriate catalysts and solvents are charged to a reaction vessel. The solvent can be a polar solvent, a non-polar solvent or a combination thereof. Exemplary solvents may include 1-methoxy-2-propanol, 1-methoxy-2-propyl acetate, ethyl lactate, anisole, cyclohexanone, 2-heptanone, diacetonealcohol, toluene, trifluorotoluene, or a combination comprising at least one of the foregoing.

In an exemplary aspect, a two-solvent system can be used in the compositions of the invention. The solvent system can include, for example, a primary solvent and an additive solvent. A further exemplary aspect uses a three-solvent system which can include, for example, a primary solvent, an additive solvent and a thinner solvent. One or more additional primary solvent, thinner solvent, additive solvent and/or other solvent may be employed.

The primary solvent exhibits excellent solubility characteristics with respect to the non-solvent components of the topcoat composition. While the desired boiling point of the primary solvent will depend on the other components of the solvent system, the boiling point is typically less than that of the additive solvent (higher evaporation rate than the additive solvent), with a boiling point of from 120 to 140° C. such as about 130° C. being typical. Suitable primary solvents include, for example, C4 to C8 n-alcohols, such as n-butanol, isobutanol, 2-methyl-1-butanol, isopentanol, 2,3-dimethyl-1-butanol, 4-methyl-2-pentanol, isohexanol and isoheptanol, isomers thereof and mixtures thereof. The primary solvent is present in an amount of from 30 to 97 wt % based on the solvent system.

The additive solvent is present to facilitate phase separation between the additive copolymer and other resin(s) in the composition. In addition, the lower evaporation rate of the additive solvent can reduce the tip drying effect during coating. It is typical for the additive solvent to have a higher boiling point (lower evaporation rate) than the other components of the solvent system. The desired evaporation rate of the additive solvent will depend on the other components of the solvent system. Suitable additive solvents include, for example, hydroxy alkyl ethers, such as those of the formula:

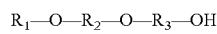

$$R_1-O-R_2-O-R_3-OH$$

wherein $R_1$ is an optionally substituted C1 to C2 alkyl group and $R_2$ and $R_3$ are independently chosen from optionally substituted C2 to C4 alkyl groups, and mixtures of such hydroxy alkyl ethers including isomeric mixtures. The additive solvent is typically present in an amount of from 3 to 15 wt % based on the solvent system.

The thinner solvent, if present, can lower the viscosity and improve coating coverage at a lower dispensing volume. The thinner solvent is typically a poorer solvent for the non-solvent components of the composition relative to the primary solvent. While the desired boiling point of the thinner solvent will depend on the other components of the solvent system, the boiling point is typically greater than that of the primary solvent (lower evaporation rate than the primary solvent). Suitable thinner solvents include, for example, alkanes such as C8 to C12 n-alkanes, for example, n-octane, n-decane and dodecane, isomers thereof and mixtures of isomers thereof; and/or alkyl ethers such as those of the formula $R_1-O-R_2$, wherein $R_1$ and $R_2$ are independently chosen from $C_2$ to $C_8$ alkyl, $C_2$ to $C_6$ alkyl and $C_2$ to $C_4$ alkyl. The alkyl ether groups can be linear or branched, and symmetric or asymmetric. The thinner solvent, if present, is typically present in an amount of from 10 to 70 wt % based on the solvent system.

The reactants in the reaction vessel are subjected to the appropriate conditions of temperature and pressure. The reactants may also be agitated during the reaction. The reactions may be conducted under a blanket of an inert gas to prevent undesirable oxidation of the reactants. When the reaction has proceeded to the appropriate extent, a quenching agent may be added to the reaction vessel to inhibit further reaction. The products along with any unreacted reactants may then be extracted from the reaction vessel and purified. Purification may be conducted by filtration, decantation, centrifuging, distillation, crystallization, or a combination thereof.

In one embodiment, in one manner of producing a nano-structured coating, the composition comprising either the first block copolymer or a combination of the first block copolymer and the second copolymer is blended with a suitable solvent. The blending can be conducted in a variety of mixers and blenders, where shear force, extensional force, compressive force, ultrasonic energy, electromagnetic energy, thermal energy or combinations comprising at least one of the foregoing forces or forms of energy are used. The blending is conducted in processing equipment wherein the aforementioned forces and forms of energy are exerted by a single screw, multiple screws, intermeshing co-rotating or counter rotating screws, non-intermeshing co-rotating or counter rotating screws, reciprocating screws, screws with pins, barrels with pins, rolls, rams, helical rotors, or combinations comprising at least one of the foregoing.

Blending involving the aforementioned forces may be conducted in machines such as single or multiple screw extruders, Buss kneaders, Henschel mixers, helicones, Ross mixers, Banbury, roll mills, molding machines such as injection molding machines, vacuum forming machines, blow molding machines, or then like, or combinations comprising at least one of the foregoing machines.

Following the blending, the composition is disposed upon a substrate. The substrate may or may not have disposed upon it a surface modification layer. The composition may be disposed on the substrate in the form of a coating having a thickness of 5 to 1000 nm, specifically 10 to 750 nm, and more specifically 15 to 500 nm. The coating is formed by methods that include spin casting, dip coating, spray painting, or by application via a doctor blade.

Figure 5:
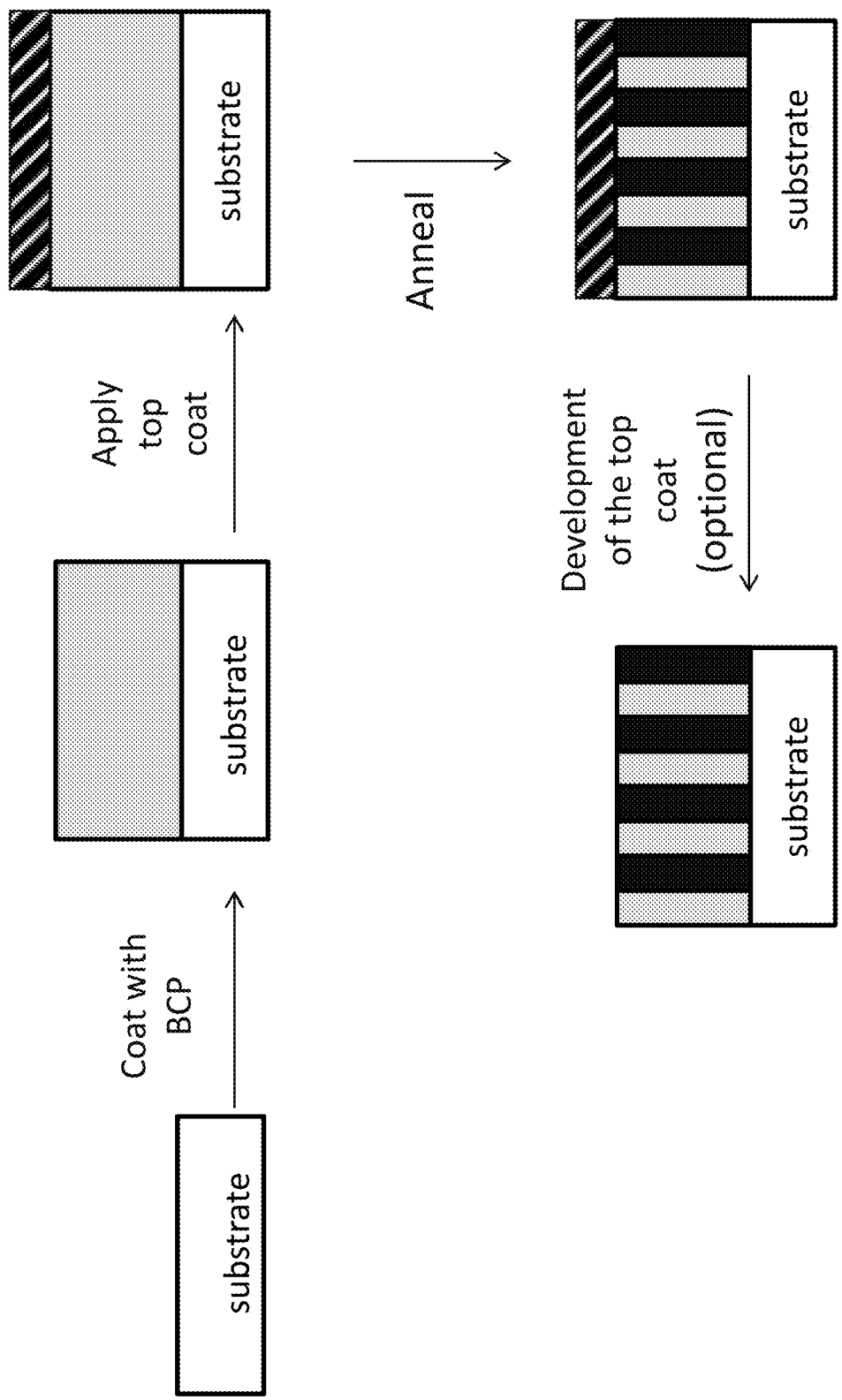
FIG. 5 is a figure depicting the formation of the top coat by first disposing the block copolymer on the substrate, disposing the top coat onto the block copolymer, and then annealing to form perpendicular blocks in the block copolymer.
Figure 6:
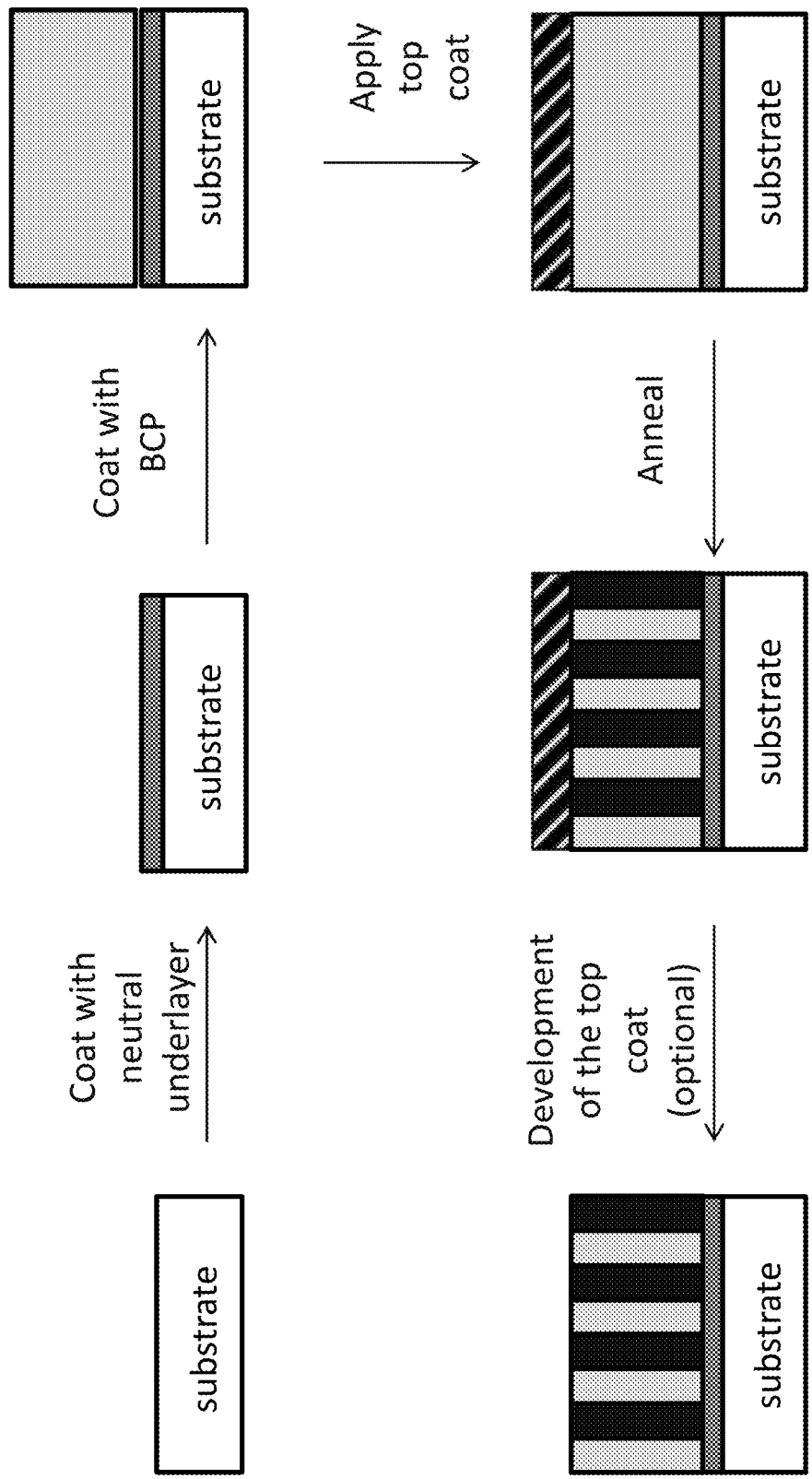
FIG. 6 is another figure depicting the formation of the top coat along with deposition of a neutral underlayer to facilitate formation of perpendicular blocks in the block copolymer.

FIGS. 5 and 6 depict the mechanism by which the top coat facilitates the formation of perpendicular microdomains in the first block copolymer. In the FIG. 5, the composition is disposed directly on the substrate to contact it, while in the FIG. 6 a surface modification layer (neutral underlayer) is disposed upon the substrate surface. The composition is spread across the surface and may be subjected to annealing to remove solvent and to facilitate the domain formation in the first block copolymer (BCP). During annealing, the surface free energy reducing moiety present in the second copolymer serves to anchor the top coat at the free surface and prevent it from intermixing with the block copolymer. The top coat provides the appropriate interfacial tensions to promote domain (i.e., micro-domain or nano-domain) formation in the first block copolymers; where the microdomains are perpendicular to the substrate. The top coat comprises the second copolymer.

The top coat on the surface of the first block copolymer may then be treated to remove it. It may be reactively ion etched, dissolved by dissolution in a solvent, chemically removed through chemical planarization or mechanically abraded. The first block copolymer with its microdomains oriented perpendicular to the substrate may then be used as an article and is treated to form a template or a photoresist and used in the manufacturing of semiconductor chips, or other electronic articles.

The compositions and the methods disclosed herein are exemplified by the following non-limiting examples.

EXAMPLES

Example 1

This example demonstrates the surface tension between the components of the second copolymer present in the top coat that can lead to the formation of a neutral surface layer on the surface of the first block copolymer. As detailed above, the second copolymer may either be added to the first block copolymer to form the disclosed composition or it may be disposed directly on the composition that comprises the first block copolymer. When a second copolymer detailed in the examples below is added to the first block copolymer or disposed upon the first block copolymer, it permits the formation of segments (of the first block polymer in the composition) that are perpendicular to the surface of the substrate upon which the first block copolymer is disposed. The second copolymer phase either separates from the first block copolymer or remains anchored on top of the first block copolymer to form an orientation control layer on the surface of the first block copolymer.

It is desirable to form an orientation control layer on both the top and bottom of the film of the first block copolymer, to have a balanced surface tension between the orientation control layer and blocks of the first block copolymer. In this example, if a first block copolymer comprises homopolymers of A and B, the surface tension between the blocks A and B and the orientation control layers are measured. The material is considered neutral when the difference in surface tension between itself and blocks A and B are approximately equal.

The Table 1 below depicts first block copolymers and second copolymers that can be used in a composition or disposed on the composition to facilitate the formation of blocks perpendicular to the surface of the substrate.

In the Table 1, the first block copolymer is first assumed to have a segment that has a particular chemistry. For example in the case of sample #1, it is assumed that one of the blocks (segments) of the first block copolymer is polystyrene (PS) and the second block is polydimethylsiloxane (PDMS). A third polymer can be found to have a balanced surface tension between itself, PS, and PDMS by first calculating the surface tension between PS and the third polymer and PDMS and the third polymer using the polar and dispersive forces of the PS and PDMS, where the surface tension ($\gamma$) between two polymers (i and j) is defined by the following equation (I), where $\sigma i,_{Total}$ is the total surface energy and $\sigma_d$ and $\sigma_p$ are the dispersive and polar components, respectively, in Equation (I):

$$\gamma_{i,j} = \sigma_{i,Total} + \sigma_{j,Total} - 4\frac{\sigma_{i,p}\sigma_{j,p}}{\sigma_{i,p}+\sigma_{j,p}} - 4\frac{\sigma_{i,d}\sigma_{j,d}}{\sigma_{i,d}+\sigma_{j,d}}, \quad (I)$$

The material can be considered neutral when the difference in these surface tensions between the third polymer and PS and the third polymer and PDMS, defined as $|\gamma_x-\gamma_y|$, are equal to 0, i.e., it is to be minimized if it cannot be equal to 0. The desirable surface energy of the third polymer is calculated by adjusting the values until the difference in surface tensions is equal to 0. This is referred to as the "optimal" value in Table 1.

In a similar manner, using the equation (I) and known surface energies, polymers can be found that have similar surface tension with the respective component polymers of the block copolymer. Listed below in the Table 1, are some potential materials for PS-PDMS, PMMA-PDMS, and PS-P2VP diblocks. In the first set of numbers, the values of surface energy that provide the minimum difference in surface tension, $|\gamma_x-\gamma_y|$ were calculated, thus representing an "optimal" third polymer with minimal difference in surface tension. Following this, polymeric materials with surface energies matching those of the optimal case were found. For example, the surface tension between poly(n-hexylmethacrylate) (PHMA) and polystyrene is very similar to that between poly(n-hexylmethacrylate) and polydimethylsiloxane. Therefore, PHMA is effective as both a surface modification layer and as the component of a top coat to facilitate perpendicular orientation of block copolymer domains. The second copolymer also contains a surface free energy reducing moiety with lower surface free energy than either PS or PDMS, such as a polymer segment based on poly(heptadecafluorooctyl methacrylate), which has $\sigma i,_{Total}$=15.3 mN/m.

A useful top coat or additive copolymer is a block copolymer with PHMA and poly(heptadecafluorooctyl methacrylate) blocks.

Poly(n-butylmethacrylate) (PBMA) provides a minimal difference in surface tension between itself and poly(methyl methacrylate) (PMMA) and polydimethylsiloxane. PBMA is therefore effective as a surface modification layer or neutral component in a top coat or additive copolymer, and a block copolymer with PBMA and poly(heptadecafluorooctyl methacrylate) blocks is an effective top coat or additive copolymer to facilitate the formation of blocks of PS and PDMS perpendicular to the surface of the substrate upon which the material is disposed.

Similarly, poly(5 and 6-[3,3,3-trifluororo-2-hydroxy-2-(trifluoro-methyl)propyl]bicyclo-[2.2.1]hept-2-ylmethacrylate) (PMABTHBNB) provides a minimal difference in surface tension between itself and polystyrene and poly(2-vinylpyridine). PMABTHBNB therefore serves as an effective surface modification layer or neutral component in a top coat or additive copolymer with affinity to the block copolymer. Top coats or additive copolymers for PS-block-P2VP include block copolymers bearing PMABTHBNB blocks, such as PMABTHBNB-block-PHMA, PMABTHBNB-block-poly(heptadecafluorooctyl methacrylate), and PMABTHBNB-block-PDMS.

either the PHFiPMA-block-PMABTHBNB or the PHFiPMA-block-PMABTHBOH were applied as top coats to form the orientation control layer. The details of this experiment are provided and discussed below.

All materials were purchased from Aldrich, except where noted, and were either used as received or purified as discussed below. Styrene was passed through activated neutral alumina. 2-vinyl pyridine (2VP), 1,1,1,3,3,3-hexafluoroisopropyl methacrylate (HFiPMA), 1,1,1-trifluoro-2-hydroxy-2-(trifluoromethyl)pent-4-ylmethacrylate (MABTHBOH) (obtained from Central Glass), and 5 and 6-[3,3,3-trifluororo-2-hydroxy-2-(trifluoromethyl)propyl]bicycro-[2.2.1]hept-2-ylmethacrylate (MABTHBNB) (obtained from Central Glass) were passed through activated basic alumina. Anhydrous toluene, trifluorotoluene, 2-cyano-2-propyl benzodithioate (CPBT), and 2,2-azobisisobutyronitrile (AIBN) were used as received. Monomers and solvents for polymerization were also deoxygenated by either purging with dry argon of 3 successive freeze-pump-thaw cycles.

A cylinder-forming PS-block-P2VP block copolymer with 31 wt % P2VP, Mn=58 kg/mol, Mw/Mn=1.07 was purchased from Polymer Source; the PS-block-P2VP was characterized to have an intercylinder spacing, $L_0$, of 44.0 nm as determined by AFM. A poly(styrene-co-2 vinyl pyri-

TABLE 1

| Sample No. | Polymer i | $\sigma_{Total}$ (mN/M) | $\sigma_d$ (MN/m) | $\sigma_p$ (mN/m) | Polymer j | $\sigma_{Total}$ (mN/m) | $\sigma_d$ (mN/m) | $\sigma_p$ (mN/M) | $\gamma_{i,j}$ (mN/M) | $\gamma_i$-$\gamma_j$ (mN/m) |
|---|---|---|---|---|---|---|---|---|---|---|
| #1 | PDMS | 19.8 | 19 | 0.8 | optimal | 31.4 | 28.4 | 3.0 | 3.1 | 0.0 |
|  | PS | 42.5 | 41.3 | 1.2 | optimal | 31.4 | 28.4 | 3.0 | 3.1 |  |
|  | PDMS | 19.8 | 19 | 0.8 | PHMA | 30 | 27 | 3.0 | 2.7 | 1.1 |
|  | PS | 42.5 | 41.3 | 1.2 | PHMA | 30.0 | 27.0 | 3.0 | 3.8 |  |
| #2 | PDMS | 19.8 | 19 | 0.8 | optimal | 31.9 | 28.0 | 3.9 | 3.8 | 0.0 |
|  | PMMA | 41.1 | 29.6 | 11.5 | optimal | 31.9 | 28.0 | 3.9 | 3.8 |  |
|  | PDMS | 19.8 | 19 | 0.8 | PBMA | 31.2 | 26.2 | 5.0 | 4.2 | 1.4 |
|  | PMMA | 41.1 | 29.6 | 11.5 | PBMA | 31.2 | 26.2 | 5.0 | 2.8 |  |
| #3 | PS | 42.5 | 41.3 | 1.2 | optimal | 29.0 | 24.6 | 4.4 | 6.1 | 0.0 |
|  | P2VP | 50.3 | 39.6 | 10.7 | optimal | 29.0 | 24.6 | 4.4 | 6.1 |  |
|  | PS | 42.5 | 41.3 | 1.2 | PMABTHBNB* | 29.3 | 24.3 | 5.0 | 6.7 | 1.0 |
|  | P2VP | 50.3 | 39.6 | 10.7 | PMABTHBNB* | 29.3 | 24.3 | 5.0 | 5.7 |  |

*poly(5 and 6-[3,3,3-trifluroro-2-hydroxy-2-(trifluoro-methyl)propyl]bicycro-[2.2.1]hept-2-yl methacrylate)

From the Table 1, it may be seen that by balancing the surface energy between the orientation control layer and the respective blocks of the first block copolymer, the respective blocks of the first block copolymer can be selected for producing microdomains that are perpendicular to the surface of the substrate that the blocks are cast upon.

Example 2

This example was conducted to demonstrate the application of a top coat on a block copolymer to form an orientation control layer. In this example, the first block copolymer is a polystyrene block poly(2-vinylpyridine) PS-block-P2VP. The second copolymer was either a) poly(1,1,1,3,3,3-hexafluoroisopropyl methacrylate)-block-poly(5 and 6-[3,3,3-trifluororo-2-hydroxy-2-(trifluoromethyl)propyl]bicycro-[2.2.1]hept-2-ylmethacrylate) (PHFiPMA-block-PMABTHBNB) or b) poly(1,1,1,3,3,3-hexafluoroisopropyl methacrylate)-block-poly(1,1,1-trifluoro-2-hydroxy-2-(trifluoromethyl)pent-4-ylmethacrylate) (PHFiPMA-block-PMABTHBOH). As will be detailed later, the PS-block-P2VP is coated on a substrate that has a polystyrene-poly(2-vinylpyridine)-polyhexylethylmethacrylate (PS-P2VP-PHEMA) brush as the surface modification layer, while dine-co-2-hydroxyethyl methacrylate) random copolymer (PS-P2VP-PHEMA) with 29 wt % 2VP, 1.5% HEMA, Mn=18 kg/mol, Mw/Mn=1.4 was synthesized according to methods described by Ji et al. in Macromolecules 2008, 41, 9098-9103. Poly(1,1,1,3,3,3-hexafluoroisopropyl methacrylate) (PHFiPMA) has a reported glass transition temperature ($T_g$) of 56° C. (http://www.safcglobal.com). Poly(1,1,1-trifluoro-2-hydroxy-2-(trifluoromethyl)pent-4-ylmethacrylate) (PMABTHBOH) and poly(5 and 6-[3,3,3-trifluororo-2-hydroxy-2-(trifluoromethyl)propyl]bicycro-[2.2.1]hept-2-ylmethacrylate) (PMABTHBNB) have Tg's of 89° C. and 159° C., respectively (reported by Sanders et al. in "Hexafluoroalcohol-functionalized Methacrylate Monomers for Lithographic/Nanopatterning Materials," Sigma-Aldrich's *Material Matters, Volume 6, Article 1*).

Synthesis of PMABTHBNB Macro-RAFT (Reversible Addition-Fragmentation Chain Transfer) Agent MAMTHBNB (5.704 g, 15.8 mmol), CPBT (0.126 g, 0.570 mmol), AIBN (0.0205 g, 0.143 mol), and 4.7 mL trifluorotoluene were added to a Schlenk flask equipped with a magnetic stirring bar. The solution was sparged with nitrogen for 15 minutes and then placed in a preheated oil bath at 70° C. for 19.5 hours. The reaction mixture was diluted with THF and precipitated from cyclohexane and dried in an oven at 60° C. overnight (99% conversion; yield 74%; $M_n$=10.9 kg/mol; $M_w$=13.0 kg/mol; Mw/Mn=1.2).

Synthesis of PHFiPMA-Block-PMABTHBNB (Top Coat 1)

HFiPMA (5.357 g, 22.7 mmol), PMABTHBNB macro-RAFT agent (3.75 g, 0.349 mmol), AIBN (0.0125 g, 0.087 mmol), and 9 mL trifluorotoluene were added to a Schlenk flask equipped with a magnetic stirring bar. The solution was sparged with nitrogen for 15 minutes and then placed in a preheated oil bath at 70° C. for 23 hours. The reaction mixture was diluted with THF and precipitated from cyclohexane and dried in an oven at 6° C. overnight (63% conversion; yield 95%). The material contained 51 wt % HFiPMA and 49 wt % PMABTHBNB by $^{13}C$ NMR and had Mn=18 kg/mol and Mw/Mn=1.2 as measured by GPC.

Synthesis of PMABTHBOH Macro-RAFT Agent 1,1,1-Trifluoro-2-hydroxy-2-(trifluoromethyl)pent-4-yl-methacrylate (MAMTHBOH, 6.54 g, 26.2 mmol), 2-cyano-2-propyl benzodithioate (CPBT, 0.145 g, 0.654 mmol), 2,2-azobisisobutyronitrile (AIBN, 0.0234, 0.163 mol), and 11 mL trifluorotoluene were added to a Schlenk flask equipped with a magnetic stirring bar. The solution was sparged with nitrogen for 15 minutes and then placed in a preheated oil bath at 70° C. for 19.5 hours. The reaction mixture was diluted with THF and precipitated from cyclohexane and dried in an oven at 60° C. overnight (96% conversion; yield 80%; $M_n$=10.7 kg/mol; $M_w$=12.4 kg/mol; $M_w/M_n$=1.2).

Synthesis of PHFiPMA-Block-PMABTHBOH (Top Coat 2)

The PMAMTHBOH macroRAFT agent (3.75 g, 0.349 mmol), HFiPMA (5.357 g, 22.7 mmol), AIBN (0.0125 g, 0.087 mmol), and 9 mL trifluorotoluene were added to a Schlenk flask equipped with a magnetic stirring bar. The solution was sparged with nitrogen for 15 minutes and then placed in a preheated oil bath at 70° C. for 23 hours. The reaction mixture was diluted with THF and precipitated from cyclohexane and dried in an oven at 60° C. overnight (63% conversion; yield 95%). The material contained 52 wt % HFiPMA and 48 wt % PMAMTHBOH by $^{13}C$ NMR and had Mn=18 kg/mol and Mw/Mn=1.3 as measured by GPC.

Preparation of Substrates with PS-P2VP-PHEMA Brush

Silicon wafers were cleaned by Ar and $O_2$ plasma on a Harrick PDC-001 plasma cleaner. The PS-P2VP-PHEMA random copolymer brush was coated on the wafers by spin coating a 0.5 wt % solution of PS-P2VP-PHEMA in toluene at 3000 rpm. Wafers were annealed at 230° C. for 60 minutes in an oven under vacuum. The wafers were cooled to room temperature and rinsed with excess toluene to give a grafted brush layer with thickness of 7.2 nm.

Characterization

Molecular weight and polydispersity values were measured by gel permeation chromatography (GPC) on an Agilent 1100 series LC system equipped with an Agilent 1100 series refractive index and MiniDAWN light scattering detector (Wyatt Technology Co.). Samples were dissolved in HPCL grade THF at a concentration of approximately 1 mg/mL and filtered through at 0.20 μm syringe filter before injection through the two PLGel 300×7.5 mm Mixed C columns (5 mm, Polymer Laboratories, Inc.). A flow rate of 1 mL/min and temperature of 35° C. were maintained. The columns were calibrated with narrow molecular weight PS standards (EasiCal PS-2, Polymer Laboratories, Inc.).

Proton NMR spectroscopy was performed on a Varian INOVA 400 MHz NMR spectrometer. Deuterated tetrahydrofuran was used for all NMR spectra. A delay time of 10 seconds was used to ensure complete relaxation of protons for quantitative integrations. Chemical shifts were reported relative to tetramethylsilane (TMS).

Inverse-gated $^{13}C$ NMR spectroscopy was performed on a Bruker Avance 400 MHz NMR spectrometer equipped with a cryoprobe. Polymers were dissolved in $CDCl_3$ in 10 mm NMR tubes at room temperature. 0.02 M chromium acetylacetonate $(Cr(acac)_3)$ was added to shorten the acquisition time. The typical sample concentration was 0.35 g/2.8 mL. All measurements were taken without sample spinning at 25° C., acquisition of 4000-8000 scans, relaxation delay of 5 s, 90° pulse length of 12.1 μs, spectrum reference of 77.27 ppm for $CDCl_3$, spectrum center at 100 ppm, and spectral width of 300 ppm.

Film thicknesses were measured on a JA Woollam ESM 300 ellipsometer. Data were collected at three different incident angles: 65, 70 and 75 degrees. All films and brushes were modeled as non-absorbing Cauchy films. Brush thickness was measured on each substrate prior to coating the block copolymer film. Block copolymer film thickness was measured using a two-layer model (block copolymer on top of the brush) in which the brush layer thickness was fixed to the previously measured value. Top coat thickness was measured using a three-layer model (top coat on top of block copolymer on top of the brush) in which the block copolymer film and brush layer thicknesses were fixed to the previously measured values.

Atomic force microscopy (AFM) images were collected by mounting wafers on the AFM stage using double-sided carbon tape and cleaned using an air gun prior to analysis. Topography and phase images were captured at ambient temperature on a Digital Instruments (now Veeco) Multi-Mode AFM equipped with a NanoScope IV controller. Nano-sensor probes with a spring constant 55 N/m and a resonant frequency in the vicinity of 167 kHz were used for phase imaging. Samples were imaged at a frequency of 0.5-2 Hz and a set point ratio of ~0.8.

A DataPhysics Instruments GmBH model OCA20 goniometer was used for all contact angle measurements. Each sample was analyzed as-received without further processing. Table in the appendix details the four test liquids used and their respective surface tensions. A movie of the drop motion was recorded for a minimum of 10 seconds for each measurement. The first drop image in the movie when the needle had been completely removed was used to determine the contact angle. The contact angle was evaluated using a circular model in the OCA software. Typical standard deviations for contact angle measurements are 2 degrees but can be as good as 0.2 degrees. Surface energies were calculated from contact angle data using Owens Wendt theory.

TABLE 1

Test liquids, polar and dispersive components used for surface energy evaluation. $\sigma_p$ and $\sigma_d$ are the polar and dispersive components of the liquid surface tension, respectively.

| Liquid | $\sigma_p$ (mN/m) | $\sigma_d$ (mN/m) | $\sigma_{Total}$ (mN/m) |
|---|---|---|---|
| Deionized Water | 52.2 | 19.9 | 72.1 |
| Formamide | 33.4 | 23.5 | 56.9 |
| Ethylene glycol | 21.3 | 26.4 | 47.7 |
| 1-bromonaphthalene | 0.0 | 44.4 | 44.4 |

X-ray Photoelectron Spectroscopy (XPS) analysis was conducted on a Kratos HSI XPS spectrometer using a monochromatic Al Kα 225 Watts (14 kV, 15 mA) X-ray Source, 80 eV (survey spectra) or 20 eV (high resolution spectra) analyzer pass energy, a take-off angle of 90°, a hybrid lens mode, an aperture of 17.05 turns (3×10 mm), a 22.5 mm (hybrid mode) iris, a 1150×700 m (hybrid) analysis area (16-84% signal level), and flood conditions with 1.7 A filament current, −2.75V charge balance, and −1.0V bias. The XPS was calibrated to Au 4f for binding energy and the span was calibrated using Au 4f and Cu 2p. The detection limit of XPS is generally accepted to be 0.1% atomic. Insulating samples are referenced to C 1 s at 285.0 eV. The spectral data was processed using CasaXPS 2.3.15 with RSF values for the Kratos instrument.

PS-Block-P2VP Thin Film with Top Coat 1 (PHFiPMA-Block-PMABTHBNB)

PS-block-P2VP films were spin cast from toluene solutions onto substrates treated with the PS-P2VP-PHEMA brush. Films were coated at a thickness of 67 nm ($\approx 1.75 L_0$), where $L_0=44$ nm is the inter-cylinder spacing of the PS-block-P2VP. A 75/25 (v/v) blend of 2-methyl-1-butanol/isobutyl isobutyrate was then used as a casting solvent for top coat films. It was verified that this solvent blend did not cause any significant change in the thickness of PS-block-P2VP films under the coating conditions employed in this work. Top Coat 1, PHFiPMA-block-PMABTHBNB, was dissolved in a 75/25 (v/v) blend of 2-methyl-1-butanol/isobutyl isobutyrate and films were cast to give top coat film thicknesses of 10 nm. The surface energy and surface fluorine content of a film was measured. The film had a surface energy of 19.9 mN/m and surface fluorine content of 31 atom % as measured by XPS.

The combined films were annealed under $N_2$ at 250° C. for 4 hours. This annealing temperature was above the Tg of the PS-P2VP as well as the highest-Tg component of the top coat (159° C.). After annealing, the surface energy and surface fluorine content of a film was re-measured. The annealed film had a surface energy of 13.8 mN/m, much lower than that of either PS or P2VP, and surface fluorine content of 31 atom % as measured by XPS. Further evidence the top coat was anchored at the top of the PS-block-P2VP layer was obtained by measuring fluorine content by XPS in films that were etched to different depths. The top coat layer and part of PS-P2VP film were removed by reactive ion etching (RIE) on a Trion Sims T2 instrument. A 15/5 (sccm) mixture of $Ar/O_2$ was used. Etching was carried out at 50 W and 50 mT for varying lengths of time to expose the top of the PS-block-P2VP film at approximately 5 nm depth in the PS-block-P2VP as well as to the middle of the PS-block-P2VP layer. The XPS analysis showed a fluorine content of 1.6 and 1.1 atom % at the top and middle of the PS-block-P2VP layer. Control experiments showed that up to 3 atom % fluorine could be re-deposited on films during etching of these materials due to contamination from fluorinated species that build up in the RIE chamber over time. The low surface energy, high fluorine content at the top surface, and lack of appreciable fluorine content in the PS-block-P2VP layer indicate the top coat is anchored at the top surface and is not migrating into the PS-block-P2VP layer during annealing.

Figure 7:
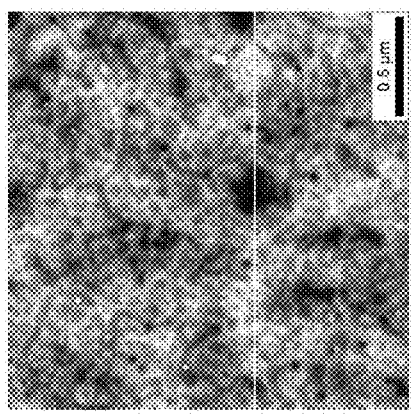
FIG. 7 shows AFM height images showing height variations across the top of PS-P2VP films annealed at 250° C. for 4 hours, (a) in the absence of top coat; (b) annealed in presence of Top Coat 1 (PHFiPMA-block-PMABTHBNB); and (c) annealed in presence of Top Coat 2 (PHFiPMA-block-PMABTHBOH).
Figure 7:
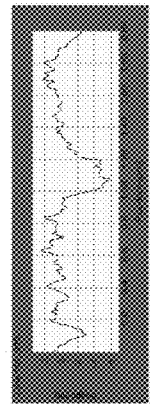
Figure 7:
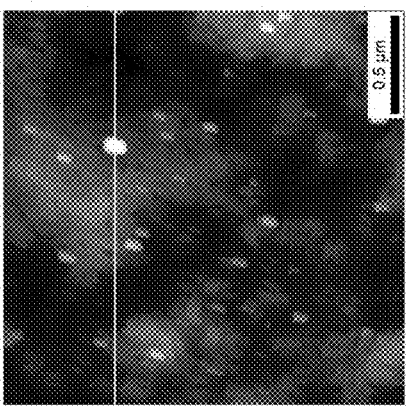
Figure 7:
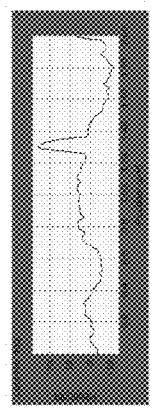
Figure 7:
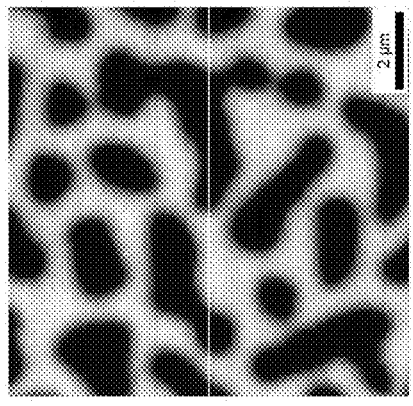
Figure 7:
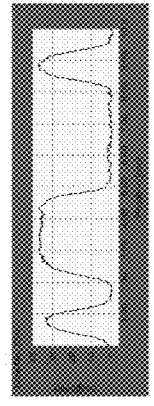

The annealed film was also analyzed by AFM, and a representative image is shown in FIG. 7. FIG. 7 shows AFM height images showing height variations across the top of PS-P2VP films annealed at 250° C. for 4 hours, (a) in the absence of top coat; (b) annealed in presence of Top Coat 1 (PHFiPMA-block-PMABTHBNB); and (c) annealed in presence of Top Coat 2 (PHFiPMA-block-PMABTHBOH) (which is detailed below). Height changes across the white lines drawn on the images are shown in the plot below each image. The image reveals a very different morphology than observed in absence of top coat. Instead of large and distinct "island-holes" with step height of 39 nm, the film showed much lower height variation of only ~6-8 nm (see FIG. 7(b)). No significant dewetting occurred in the PS-block-P2VP film, indicating Top Coat 1 mitigated the large surface energy difference between PS and P2VP and stabilized the formation if P2VP cylinders with their axis oriented perpendicular to the substrate.

PS-Block-P2VP Thin Film with Top Coat 2 (PHFiPMA-Block-PMABTHBOH)

PS-block-P2VP films were spin cast from toluene solutions onto substrates treated with the PS-P2VP-PHEMA brush. Films were coated at a thickness of 67 nm ($\approx 1.75 L_0$), where $L_0=44$ nm is the inter-cylinder spacing of the PS-block-P2VP. A 75/25 (v/v) blend of 2-methyl-1-butanol/isobutyl isobutyrate was then used as a casting solvent for top coat films. It was verified that this solvent blend did not cause any significant change in the thickness of PS-block-P2VP films under the coating conditions employed in this work. Top Coat 2, PHFiPMA-block-PMABTHBOH, was dissolved in a 75/25 (v/v) blend of 2-methyl-1-butanol/isobutyl isobutyrate and films were cast to give top coat film thicknesses of 10 nm. The surface energy and surface fluorine content of the film was measured. The film had a surface energy of 17.6 mN/m and surface fluorine content of 33% as measured by XPS.

The films were annealed under $N_2$ at 250° C. for 4 hours. This annealing temperature was above the Tg of the PS-P2VP as well as the highest-Tg component of the top coat (89° C.). After annealing, the surface energy and surface fluorine content of a film was re-measured. The annealed film had a surface energy of 13.8 mN/m, much lower than that of either PS or P2VP, and surface fluorine content of 31% as measured by XPS. The low surface energy and high fluorine content at the top surface indicate the top coat is anchored at the top surface and is not migrating into the PS-block-P2VP layer during annealing.

The annealed film was also analyzed by AFM, and a representative image is shown in FIG. 7(C). The image revealed a very different morphology than observed in absence of top coat. Instead of large and distinct "island-holes" with step height of 39 nm, the film showed much lower height variation of only ~6-8 nm. No significant dewetting occurred in the PS-block-P2VP film, indicating the Top Coat 2 mitigated the large surface energy difference between PS and P2VP and stabilized the formation if P2VP cylinders with their axis oriented perpendicular to the substrate.

What is claimed is:

1. A method comprising:
   disposing a first composition comprising a first block copolymer and a second copolymer upon a substrate; where the first block copolymer comprises a first segment and a second segment that are covalently bonded to each other and that are chemically different from each other; where the first segment has a first surface free energy and where the second segment has a second surface free energy; and
   where the second copolymer comprises a surface free energy reducing moiety; where the surface free energy reducing moiety has a lower surface free energy than the first surface free energy and the second surface free energy; the second copolymer further comprising one or more moieties having an affinity to the first block copolymer; where the surface free energy reducing moiety is chemically different from the first segment and from the second segment; and where the second copolymer contacts the top free surface of the first block copolymer.

2. The method of claim 1, where the second copolymer is operative to form an orientation control layer on a surface of the composition and to facilitate formation of microdomains in the first block copolymer that are perpendicular to a surface of the substrate that the composition is disposed on.

3. The method of claim 1, where the surface free energy reducing moiety is covalently bonded to a plurality of the same monomers that comprise the first segment and/or to the same monomers that comprise the second segment.

4. The method of claim 1, where the second copolymer comprises a blend of copolymers, each of which comprises a surface free energy reducing moiety that is covalently bonded to a plurality of the same monomers that comprise the first segment and/or to the same monomers that comprise the second segment.

5. The method of claim 1, where the first composition further comprises a solvent that is immiscible with the first block copolymer.

6. The method of claim 1, further comprising an annealing step.

7. The method of claim 2, further comprising removing the orientation control layer to expose the underlying block copolymer.

8. The method of claim 7, further comprising selectively removing portions of the block copolymer to form a patterned resist layer.

* * * * *